United States Patent

Lai et al.

[11] Patent Number: 6,129,043
[45] Date of Patent: Oct. 10, 2000

[54] GAS TUBE WITH HEATING APPARATUS

[75] Inventors: Chien-Hsin Lai, Kaohsiung Hsien; Fu-Yang Yu, Hsinchu, both of Taiwan

[73] Assignee: United Microelectronics Corp., Hsinchu, Taiwan

[21] Appl. No.: 09/257,577

[22] Filed: Feb. 25, 1999

[51] Int. Cl.[7] .................... C23C 10/00; C23C 16/455; F17D 1/04; F28C 1/14

[52] U.S. Cl. .................... 118/715; 137/340; 392/478; 165/80.2

[58] Field of Search .................... 118/726, 715; 261/142; 392/480, 481, 482, 486, 489, 490, 478; 165/154, 135, 80.1, 80.2; 137/340

[56] References Cited

U.S. PATENT DOCUMENTS 5,343,937 9/1994 Gross .................... 137/340
5,362,328 11/1994 Gardiner et al. .................... 118/726

*Primary Examiner*—Shrive Beck
*Assistant Examiner*—Sylvia R. MacArthur
*Attorney, Agent, or Firm*—Jiawei Huang; J.C. Patents

[57] ABSTRACT

A gas tube with heating apparatus. The gas tube is applicable in a chemical vapor deposition machine. The gas comprises a gas circulating tube and a coaxial gas tube invaginating a gas transporting tube therein. A heater is installed in the gas circulating tube, while the coaxial tube is covered by a thermal insulating layer. In addition, a control valve, a pressure gauge, and a particle trap are installed in a gas supplying tube connecting with the gas circulating tube.

13 Claims, 1 Drawing Sheet

GAS TUBE WITH HEATING APPARATUS

BACKGROUND OF THE INVENTION

1. Field of the Invention

The invention relates to a gas tube with a heating apparatus, and more particularly, to a gas tube with heating apparatus applied in a chemical vapor deposition (CVD) machine.

2. Description of the Related Art

Chemical vapor deposition is one of the most popular methods for fabricating a thin film. By a chemical reaction, a gas reactant is reacted into a solid product in a reactor, and thus, a thin film of the solid product is formed. The reaction is typically reacted in a substantially high temperature, so that the thermal effect affects the reaction greatly.

During the chemical vapor deposition process, the temperature has a great effect towards the deposition rate and uniformity of the thin film. Thus, to improve the deposition and the uniformity of the thin film, it is important for heating the gas reactant in the transporting tube. In the conventional method, the gas transporting tube is wrapped by a heat tape to raise and keep the temperature of the gas. However, since the heat tape cannot cover the gas tube evenly, moreover, a heat exchange between the heat tape and the external ambient is easily caused, therefore, the heating effect and uniformity of the gas is poor. In addition, after the maintenance of the machine, a longer time is consumed to heat the gas transporting tube up to an operation temperature. Thus, the efficiency of the machine is degraded.

SUMMARY OF THE INVENTION

Accordingly, the invention provides a gas tube with a heating apparatus applicable for a chemical vapor deposition machine. A reactant gas in a gas transporting tube can be heated uniformly and rapidly to reach an operation temperature before being supplied to a reactor. In addition, the gas leaking condition of the gas transporting tube can be monitored.

The invention provides a gas tube with a heating apparatus applicable for a chemical vapor deposition machine. The gas tube comprises a coaxial gas tube invaginating a gas transporting tube therein. Though being designed and installed coaxially, the gas transporting tube is not conducted with the coaxial gas tube. The coaxial gas tube has two ends connected to a gas circulating tube to construct a loop. A heating apparatus is installed in the circulating tube to raise the temperature of the gas conducted into the loop. The gas transporting tube is heated by the gas with a raised temperature. The temperature of the reactant gas is thus raise to a required operation temperature. In addition, a particle trap is installed in the gas circulating tube to filter impurities contained by the gas in the loop. The gas in the loop is supplied by a gas supplier. A controlling valve is further installed in a gas supplier to adjust the quantity of the gas input into the circulating loop. While the controlling valve is shut, a closed loop is formed between the coaxial gas tube and the gas circulating tube. In the gas supplying tube, a pressure gauge is installed at a joint of the controlling valve and the gas circulating tube. While a close loop is formed by shutting the controlling valve, the pressure variation in the closed loop is monitored by the pressure gauge, so that whether there is a leaking effect is detected.

It is to be understood that both the foregoing general description and the following detailed description are exemplary and explanatory only and are not restrictive of the invention, as claimed.

DESCRIPTION OF THE PREFERRED EMBODIMENTS

Figure 1:
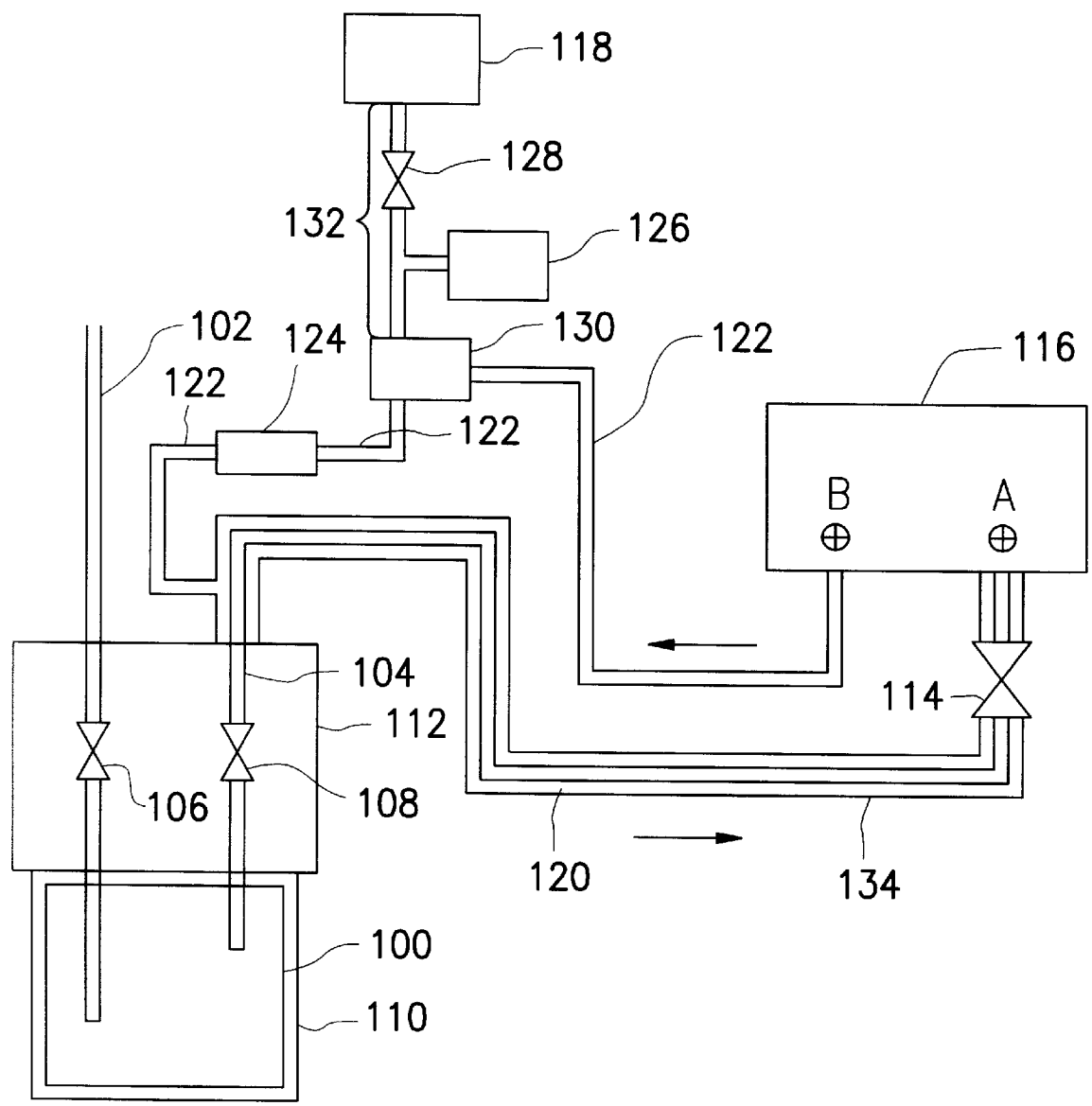
FIG. 1 shows a gas tube with a heating apparatus according to a preferred embodiment of the invention.

In FIG. 1, in a chemical vapor deposition machine, a reacting chamber 116 is functioned to contain wafers and to deposit thin films onto the wafers. A bubbler 100 is used to contain a liquid compound required for the deposition reaction. With a carrier gas input tube 102, a carrier gas can be conducted into the bubbler 100 to increase the partial pressure of the liquid compound. A reactant gas produced in the bubbler 100 is transported into the chamber 116 for deposition reaction by a gas transporting tube 104. In the gas transporting tube 104 near the chamber 116, a chamber controlling valve 114 is installed to control the quantity of the reactant gas in the chamber 116.

To increase a saturated vapor pressure of the chemical required for the reaction in the bubbler 100, the bubbler 100 is housed with a bubbler heater 110. Furthermore, a hot can 112 is installed adjacent to the bubbler 100 to continuously heat the gas transporting tube 104, so as to maintain the temperature of the gas therein to advantage the thin film deposition. In addition, in positions near the bubbler 100, a carrier gas controlling valve 106 and a gas output controlling valve 108 are installed in the carrier gas input tube 102 and the gas transporting tube 104, respectively.

To keep the reacting gas at a certain temperature range, so as to obtain a determined deposition rate and a uniform thin film, a heating process is required along the gas transporting tube 104 out of the bubbler 100 and the hot can 112. Therefore, a gas output coaxial tube 120 is provided to invaginate the gas transporting tube 104 therein. The gas transporting tube 104 and the gas output coaxial tube 120, though being coaxially installed, can not be conducted with each other. That is, the gas contained or transported by the gas transporting tube 104 can not flow into the gas output coaxial tube 120. Similarly, the gas contained or transported by the gas output coaxial tube 120 cannot flow into the gas transporting tube 104 either. The gas output coaxial tube 120 is wrapped by a thermal insulating layer 134 to isolate a heat convection between the gas output coaxial tube 120 and the ambience.

To continuously heat the gas transporting tube 104 and to maintain the temperature thereof in a form of a close circulating loop, a gas circulating tube 122 is connected to two ends of the gas output coaxial tube 120. As shown in the figure, the gas circulating tube 122 has a terminal B in one end in the chamber 116. The terminal is then coupled to a terminal A in one end of the gas output coaxial tube 120. It is appreciated that the connection type does not have to go through the chamber 116 as shown in the figure. Other method, for example, a connection of the gas circulating tube 122 and the gas output coaxial tube 120 can also be made external of the chamber 116. In this embodiment, a heater 124 is installed in the gas circulating tube 122. The gas circulating tube 122 is heated thereby, and thus, to input a high temperature gas into the gas output coaxial tube 120. Therefore, the gas transporting tube 104 is heated by the high temperature gas in the gas output coaxial tube 120, and the reacting gas in the gas transporting tube 104 is kept at a required operation temperature for deposition. A particle trap 130 is further installed in the gas circulating tube 122 to filter any impurity contained in the circulating loop.

The gas, for example, a nitrogen gas, in the circulating loop is provided by a gas supplier 118. Through the gas supplying tube 132, the gas is conducted into the circulating loop. In the embodiment, the gas supplying tube 132 has one end connected to the gas supplier 118, and the other end connected to the particle trap 130. However, the connection may also be formed in other way such as connecting the other end of the gas supplying tube 132 with the gas circulating tube 122 directly. In the gas supplying tube 122 near the gas supplier 118, a gas supplying controlling valve 128 is further installed to control the quantity of the provided heating gas.

In addition, in the gas supplying tube 132, a pressure gauge 126 is installed at a joint (for example, the particle trap 130) of gas supplying tube 132 and the gas circulating tube 122. Thus, when the gas supplying controlling valve 128 is shut, a close circulating loop is formed between the gas circulating loop 122 and the gas output coaxial tube 120. The gas in the close circulating loop flows in a direction denoted as the arrow shown in the FIGURE. The gas pressure in the circulating loop is monitored by the pressure. In case a gas leak occurs, it is detected by the pressure gauge 126 according to the pressure variation. A maintenance of the machine can thus be proceeded right away.

In the invention, the gas transporting tube is invaginated with a gas output coaxial tube. A heater is used to produce a high temperature gas and to conduct the high temperature gas into the gas output coaxial tube. As a consequence, through the heat conduction, the reactant gas in the gas transporting tube can be heated and kept at a required operation temperature, so that the deposition reaction can be advantaged.

The invention further comprises advantage such as a short time is required to heat the reactant gas. After maintenance, it does not require a long time to heat the reactant gas to an operation temperature such as the conventional machine. Furthermore, in case a gas leaking effect occurs, it is spontaneously detected by the pressure gauge. A mending process can thus be performed without causing any failure, and the efficiency of the machine is highly enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A gas tube with a heating apparatus, installed in a chemical vapor deposition machine which comprises a reacting chamber, a gas transporting tube with one end connected to the reacting chamber, the gas tube comprising:

a coaxial tube, carrying a high temperature gas therein invaginating the gas transporting tube coaxially, wherein the high temperature gas keeps a reactant gas in the gas transporting tube at a required operation temperature;

a gas circulating tube, with two ends coupled to two ends of the coaxial tube to construct a circulating loop;

a heater, installed in the gas circulating tube;

a gas supplying tube, with one end coupled to the gas circulating tube; and a controlling valve, installed in the gas supplying tube.

2. The gas tube with a heating apparatus according to claim 1, further comprising a pressure gauge in communication with said gas supplying tube.

3. The gas tube with a heating apparatus according to claim 1, further comprising a particle trap installed in the gas circulating tube.

4. The gas tube with a heating apparatus according to claim 3, wherein the particle trap is coupled to the gas supplying tube.

5. The gas tube with a heating apparatus according to claim 1, further comprising a gas supplier connected with the gas supplying tube.

6. The gas tube with a heating apparatus according to claim 5, wherein a nitrogen gas is provided by the gas supplier.

7. A chemical vapor deposition machine, comprising a reacting chamber, a bubbler, a gas input tube with one end connected to the bubbler, a gas transporting tube connected to the bubbler and the reacting chamber, wherein the chemical vapor deposition machine further comprises:

a gas transporting coaxial tube, carrying a high temperature gas therein and invaginating the gas transporting tube without any conducting path to the gas transporting tube, wherein the high temperature gas keeps a reactant gas in the gas transporting tube at a required operation temperature;

a gas circulating tube, with two ends coupled to two ends of the gas transporting coaxial tube, respectively;

a gas supplying tube, with one end coupled to the gas circulating tube, and the other end coupled to a gas supplier; and a controlling valve, installed in the gas supplying tube.

8. The gas tube with a heating apparatus according to claim 7, further comprising a pressure gauge in communication with the gas supplying tube.

9. The chemical vapor deposition machine according to claim 8, further comprising a particle trap installed in the gas circulating tube.

10. The chemical vapor deposition machine according to claim 7, wherein the particle trap is coupled to the gas supplying tube.

11. The chemical vapor deposition machine according to claim 7, wherein a nitrogen gas is provided by the gas supplier.

12. The gas tube with a heating apparatus according to claim 1, further comprising a thermal insulating layer covering the gas transporting coaxial tube.

13. The gas tube with a heating apparatus according to claim 7, further comprising a thermal insulating layer covering the gas transporting coaxial tube.

* * * * *